(12) United States Patent
Fujinoki et al.

(10) Patent No.: US 11,757,075 B2
(45) Date of Patent: Sep. 12, 2023

(54) SILICA GLASS MEMBER FOR HERMETIC SEALING OF ULTRAVIOLET SMD LED ELEMENT AND METHOD FOR MANUFACTURING QUARTZ GLASS MEMBER FOR ULTRAVIOLET LED

(71) Applicant: SHIN-ETSU QUARTZ PRODUCTS CO., LTD., Tokyo (JP)

(72) Inventors: Akira Fujinoki, Tokyo (JP); Hiroyuki Nishimura, Koriyama (JP); Akira Sato, Koriyama (JP); Yuya Yokosawa, Koriyama (JP); Tatsuya Mori, Koriyama (JP)

(73) Assignee: SHIN-ETSU QUARTZ PRODUCTS CO., LTD., Tokyo (JP)

( * ) Notice: Subject to any disclaimer, the term of this patent is extended or adjusted under 35 U.S.C. 154(b) by 0 days.

(21) Appl. No.: 17/559,031

(22) Filed: Dec. 22, 2021

(65) Prior Publication Data

US 2022/0115570 A1   Apr. 14, 2022

Related U.S. Application Data

(62) Division of application No. 16/306,185, filed as application No. PCT/JP2017/018817 on May 19, 2017.

(30) Foreign Application Priority Data

Jun. 1, 2016  (JP) .................................. 2016-110033
Jul. 1, 2016  (JP) .................................. 2016-131887

(51) Int. Cl.
*H01L 33/58* (2010.01)
*C03B 19/06* (2006.01)
(Continued)

(52) U.S. Cl.
CPC ............ *H01L 33/58* (2013.01); *C03B 19/066* (2013.01); *C03C 3/06* (2013.01); *C03C 4/0085* (2013.01);
(Continued)

(58) Field of Classification Search
CPC ... H01L 33/58; H01L 33/486; H01L 25/0753; C03B 19/066; C03C 3/06; C03C 4/0085
See application file for complete search history.

(56) References Cited

U.S. PATENT DOCUMENTS 8,575,637  B2 *  11/2013  Bae ........................ H01L 33/60
                                                           257/98
2007/0205419 A1 *  9/2007  Ono ....................... H01L 33/58
                                                           438/22
(Continued)

FOREIGN PATENT DOCUMENTS

JP             2011003341  A  *  1/2011

*Primary Examiner* — Mary Ellen Bowman
(74) *Attorney, Agent, or Firm* — McGlew and Tuttle, P.C.

(57) ABSTRACT

Provided is a silica glass member for hermetic sealing of an ultraviolet SMD LED element to be suitably used for hermetic sealing of, and as a transmission window material for, a surface mount-type package (SMD) having an ultraviolet LED mounted thereon and configured to emit ultraviolet light in a wavelength range of from 200 nm to 350 nm. The silica glass member for hermetic sealing includes a silica glass substrate, which is homogeneously and integrally formed without an internal boundary, wherein the silica glass substrate has: a first surface on an inside opposed to an SMD LED element; and a second surface on an outside corresponding to the first surface, wherein an outer peripheral portion of the first surface has formed therein a substrate joining plain surface for joining to the container outer periphery joining plain surface, and wherein the second surface on the outside corresponding to the first surface has (Continued)

formed therein a lens-like convex portion configured to process emitted light from the ultraviolet SMD LED element.

16 Claims, 5 Drawing Sheets

(51) Int. Cl.
*H01L 25/075* (2006.01)
*H01L 33/48* (2010.01)
*C03C 3/06* (2006.01)
*C03C 4/00* (2006.01)
*H01L 33/32* (2010.01)

(52) U.S. Cl.
CPC ........ *H01L 25/0753* (2013.01); *H01L 33/486* (2013.01); *C03B 2201/04* (2013.01); *C03C 2201/23* (2013.01); *H01L 33/32* (2013.01); *H01L 2933/0058* (2013.01)

(56) References Cited

U.S. PATENT DOCUMENTS

| | | | |
|---|---|---|---|
| 2008/0164631 A1* | 7/2008 | Watanabe | C03B 19/06 264/177.11 |
| 2013/0043499 A1* | 2/2013 | Ohta | H01L 33/483 257/E33.072 |
| 2013/0234274 A1* | 9/2013 | Kam | H01L 33/58 257/432 |

* cited by examiner

Comparative Example 1
Apparent transmittance of silica glass having applied thereto adhesive
Silica glass having thickness of 3 mm+adhesive having thickness of 0.2 mm

SILICA GLASS MEMBER FOR HERMETIC SEALING OF ULTRAVIOLET SMD LED ELEMENT AND METHOD FOR MANUFACTURING QUARTZ GLASS MEMBER FOR ULTRAVIOLET LED

CROSS REFERENCE TO RELATED APPLICATIONS

This application is a divisional under 37 CFR 1.53(b) of pending prior U.S. application Ser. No. 16/306,185 filed Nov. 30, 2018 and claims the benefit (35 U.S.C. § 120 and 365(c)) of International Application PCT/JP2017/018817 filed May 19, 2017, which designated inter alia the United States and which claims the priority of Japanese Patent Application 2016-110033 filed Jun. 1, 2016 and Japanese Patent Application 2016-131887 filed Jul. 1, 2016, the entire contents of each application are incorporated herein by reference

TECHNICAL FIELD

The present invention firstly relates to a silica glass member to be used for hermetic sealing of an ultraviolet LED configured to emit ultraviolet light in a wavelength range of from 200 nm to 350 nm, and more specifically, to a silica glass member to be suitably used for hermetic sealing of, and as a transmission window material for, a surface mount-type package (commonly called a surface mount device (SMD)) having an ultraviolet LED mounted thereon and configured to emit ultraviolet light in a wavelength range of from 200 nm to 350 nm. The present invention secondly relates to a method of manufacturing a quartz glass member for an ultraviolet LED at a wavelength of from 200 nm to 400 nm.

BACKGROUND ART

An ultraviolet LED configured to emit light in a deep ultraviolet wavelength band is expected to be applied in a wide range of fields, such as virus sterilization, drinking water, air purification, resin curing, decomposition of environmental pollutants, a food field, and various kinds of medical equipment.

A gas light source, such as a mercury lamp, has been used as an existing deep ultraviolet light source. However, a range of use of the gas light source is limited because of its short lifetime, its emission wavelength, which is limited only to an emission line of a gas, a substance contained therein that is harmful to a human body/environment, such as mercury, and an extremely large size and power consumption of the light source. Therefore, there has been an increasing demand for realization of an alternative technology. Under such circumstances, it is strongly desired to develop a mercury-free, low-environmental-load, downsized, high-output ultraviolet LED, and an ultraviolet LED using a nitride-based semiconductor (AlGaN) has been actively developed.

The ultraviolet LED emits light having a wavelength of from 200 nm to 400 nm, and has a problem in that a lens made of a silicone resin, which has hitherto been used for a visible light LED, undergoes deterioration of the resin or does not transmit the light.

In addition, there is also a problem in that light extraction efficiency from an ultraviolet LED element is extremely low. Accordingly, a material that absorbs as little light as possible is required also for a window material or a lens material, and use of an optical member made of quartz glass has been considered (Patent Documents 1 and 2).

However, there are problems in that, with a window plate made of quartz glass, light is diffused, and hence a desired light intensity is not obtained, and a hemispherical lens is difficult to mount on a package.

Meanwhile, an injection molding method is known as a method of manufacturing a quartz glass member with high accuracy in dimensions and shape (Patent Documents 9 and 11).

This method can provide a transparent quartz glass body by degreasing and purifying a molded body, followed by firing, but has a problem in that purification treatment with chlorine or hydrogen chloride generates an optical absorption band at a wavelength of about 250 nm (5.0 eV) due to an oxygen-deficient defect (Non Patent Document 1).

In addition, there is a proposal of a method involving, after vitrification, repairing the oxygen-deficient defect with an atmosphere containing oxygen or an atmosphere containing water vapor. However, the method is limited in its effect to a quartz glass surface and requires treatment at high temperature. Accordingly, there is a risk of a reduction in transmittance due to an influence of contamination with an impurity (Patent Documents 18 and 19).

In addition, in recent years, rapid progress has been made in shortening wavelengths of semiconductor light-emitting elements (LEDs). Of those, an ultraviolet LED having, as its emission region, ultraviolet light having a relatively long wavelength (commonly called UVA, and falling within a wavelength range of from 380 nm to 315 nm) has already been put into practical use for curing a UV-curable resin.

UVB (falling within a wavelength range of from 315 nm to 280 nm) and UVC (falling within a wavelength range of from 280 nm to 200 nm) each having a shorter wavelength than UVA are currently being intensively developed. In particular, UV light having a wavelength of around 260 nm, which is called a germicidal ray, has an intense germicidal action, and hence there is a demand that its practical use be soon achieved as inexpensive means for sterilizing water or sterilizing air.

It is said that there are significant technical obstacles between UVA and UVB or UVC. One of the obstacles is a substrate material, and another is a transmitting material. UVA is formed on a sapphire substrate ($Al_2O_3$), but UVB and UVC each require an AlN substrate due to lattice constant matching.

Meanwhile, for ultraviolet light of UVA, a window or a lens can be formed using an organic resin having a high UV transmission property, such as a silicone or Teflon (trademark). However, for ultraviolet light of UVB or UVC, such organic material is insufficient in terms of light transmission property, and is also insufficient in terms of durability against UV light. In addition, a borosilicate-based glass material having a satisfactory UV transmission property, which is often used for UVA, LED, also cannot be used due to problems with the light transmission property (even borosilicate glass hardly transmits ultraviolet light having a wavelength of 350 nm or less) and the durability.

For this reason, silica glass has been exclusively used as a window material or lens material for a UVB-LED or a UVC-LED (Patent Documents 1 and 2). The silica glass has a high transmission property for UV light and also has high durability, and hence has sufficient characteristics as the window material or lens material for a UVB-LED or a UVC-LED. However, the silica glass needs polishing in order to constitute a smooth surface having a high light transmission property suitable as the window material or the lens material, and hence cannot integrally constitute a smooth surface in a member in which a plain surface and a spherical surface coexist. For example, when, as proposed in the present invention, an outer peripheral portion has a plain surface and a structure having a convex spherical surface shape is formed inside a central side, a planar silica glass plate material and a hemispherical lens need to be each independently produced, polished, and bonded to each other.

However, from the viewpoint of serving as a member for a UVB-LED or a UVC-LED, there is hardly any adhesive having a sufficient transmission property and sufficient durability in such wavelength region.

In addition, mounting of LEDs, not limited to ultraviolet LEDs, is classified into a shell-type package and an SMD-type package. An LED element is an extremely fragile semiconductor element, and hence needs to be kept in a sealed environment for the purpose of preventing deterioration due to moisture or the like in the atmosphere. The shell-type package is a package in which a surrounding space of an LED is sealed with a resin, and is widely used as an inexpensive LED package.

Meanwhile, the SMD package has a structure in which an LED element is mounted on a concave recessed portion, a bottom surface and a side wall surface are each constituted of a reflector, and an upper surface is tightly sealed with a window material for hermetic sealing (Patent Document 3).

Further, when output is insufficient with one LED element, a multi-type package in which a plurality of elements are arranged in one package is also beginning to be widely used.

PRIOR ART DOCUMENTS

Patent Documents

Patent Document 1: JP 2015-133505 A
Patent Document 2: JP 2015-179734 A
Patent Document 3: JP 2009-99759 A
Patent Document 4: WO 2006-85591 A1
Patent Document 5: JP 2006-232582 A
Patent Document 6: JP 2006-248798 A
Patent Document 7: JP 2006-290666 A
Patent Document 8: JP 2006-315910 A
Patent Document 9: JP 2006-321691 A
Patent Document 10: JP 2014-15389 A
Patent Document 11: JP 4446448 B2
Patent Document 12: JP 4484748 B2
Patent Document 13: JP 4498173 B2
Patent Document 14: JP 4539850 B2
Patent Document 15: JP 5177944 B2
Patent Document 16: JP 5512084 B2
Patent Document 17: JP 5830502 B2
Patent Document 18: JP 2008-195590 A
Patent Document 19: JP 2009-203144 A Non Patent Document Non Patent Document 1: H. Iwai et al. (1988) Two types of oxygen-deficient centers in synthetic silica glass. Physical Review B. Vol. 38, No. 17, pp. 12772-12775

SUMMARY OF THE INVENTION

Problems to be Solved by the Invention

A first object of the present invention is to provide a silica glass member to be used for hermetic sealing of an ultraviolet LED configured to emit ultraviolet light in a wavelength range of from 200 nm or more to 350 nm or less, in particular, a silica glass member for hermetic sealing of an ultraviolet surface mount device (SMD) LED element to be suitably used for hermetic sealing of, and as a transmission window material for, a surface mount-type package (commonly called an SMD) having an ultraviolet LED mounted thereon and configured to emit ultraviolet light in a wavelength range of from 200 nm or more to 350 nm or less. A second object of the present invention is to provide a method of manufacturing a quartz glass member for an ultraviolet LED, which involves repairing an oxygen-deficient defect so that there can be obtained a quartz glass member for an ultraviolet LED improved in light absorption at a wavelength of about 250 nm and free of absorption due to a structural defect at a wavelength of from 200 nm to 400 nm.

Means for Solving Problems

According to one embodiment of the present invention, there is provided a silica glass member for hermetic sealing of an ultraviolet SMD LED element that is configured to emit light in a wavelength range of from 250 nm to 350 nm and is placed in a hermetic sealing container having a container outer periphery joining plain surface formed in an outer peripheral portion thereof, the silica glass member for hermetic sealing including a silica glass substrate, which is homogeneously and integrally formed without an internal boundary, wherein the silica glass substrate has: a first surface on an inside opposed to the SMD LED element; and a second surface on an outside corresponding to the first surface, wherein an outer peripheral portion of the first surface has formed therein a substrate joining plain surface for joining to the container outer periphery joining plain surface, and wherein the second surface on the outside corresponding to the first surface has formed therein a lens-like convex portion configured to process emitted light from the ultraviolet SMD LED element.

A plurality of the lens-like convex portions are suitably formed on the second surface. The substrate joining plain surface formed in the first surface preferably has a surface accuracy of 1 µm or less and a surface roughness of 0.1 µm or less in terms of Ra value, and the lens-like convex portion in the second surface preferably has a surface roughness of 0.2 µm or less in terms of Ra value.

The silica glass member for hermetic sealing of the present invention suitably has an internal transmittance at a thickness of 3 mm of 95% to 99% for ultraviolet light having a wavelength of 300 nm to 400 nm and an internal transmittance at a thickness of 3 mm of 92% to 99% or less for ultraviolet light having a wavelength of 245 nm or more and less than 300 nm.

In the silica glass member for hermetic sealing of the present invention, bubbles contained in the silica glass member for hermetic sealing each preferably have a diameter of 50 µm or less, and the bubbles contained preferably have a total cross-sectional area of $1 \times 10^{-3}$ mm$^2$ or less per 0.1 cm$^3$ of a volume of the silica glass member for hermetic sealing.

In the silica glass member for hermetic sealing of the present invention, respective differences between internal transmittances of the silica glass member for hermetic sealing at a thickness of 3 mm for ultraviolet light having wavelengths of 350 nm, 300 nm, and 250 nm measured using an integrating sphere and internal transmittances thereof at a thickness of 3 mm for ultraviolet light having wavelengths of 350 nm, 300 nm, and 250 nm in general measurement are each suitably within 0.5%.

The silica glass member for hermetic sealing of the present invention preferably contains OH groups at a concentration of 0.1 ppm to 20 ppm.

The transmittance measurement with the integrating sphere is described. In the transmittance measurement of silica glass in which internal scattering due to a bubble or a granular structure exists, a transmittance measurement apparatus based on a general optical system cannot distinguish between internal absorption and a scattering loss, and hence allows the scattering loss to be measured as absorption. Meanwhile, a transmittance measurement apparatus including the integrating sphere, which is applicable to UV light, enables also scattered light to be introduced into a photodetector, and hence enables an absorption amount excluding the scattering loss to be measured. In other words, an internal transmittance obtained by the transmittance measurement using the integrating sphere is considered not to include the scattering loss, and hence enables the scattering loss to be estimated through a comparison to an internal transmittance obtained by the general transmittance measurement. Specifically, the following equation holds: internal transmittance obtained by general transmittance measurement (=internal absorption+scattering loss)−internal transmittance obtained by integrating sphere measurement (internal absorption)=scattering loss. In actuality, even the integrating sphere measurement cannot pick up all the scattering loss, and hence it is reasonable to consider that part of the scattering loss is measured. However, the intensity of the scattering loss can be specified through this comparison.

The silica glass member for hermetic sealing of the present invention is silica glass suitable for a transparent window material and/or a lens material for an LED configured to emit ultraviolet light of UVB or UVC, in which the window material and the lens material, which have originally been separately cut out and subjected to polishing processing, are integrally formed, thereby having an advantage of being able to be inexpensively supplied. In addition, in this case, when a plurality of lens portions are simultaneously formed in one silica glass member for sealing, there is an advantage in that a further cost effect is obtained.

As specific means, powder of synthetic silica glass is mixed and kneaded with a binder, and the mixture is subjected to press molding in a mold for molding a required shape to provide a green body, which is subjected to heat treatment to be made transparent. Thus, a silica glass molded body for hermetic sealing of the present invention having a complicated shape integrally and homogeneously formed into a predetermined shape can be obtained.

Originally, some requirements need to be satisfied in order to constitute a window material or a lens material for ultraviolet light having a short wavelength, such as UVB or UVC, by mold molding using silica glass powder as a starting material. That is, the following are required in order to obtain the required transmittance, light durability, and moldability: the purity and particle size of the silica glass powder serving as the starting material be appropriately controlled; the inner surface finish of the molding mold be sufficiently smooth so as not to require post-polishing; structural defects of silica glass generated in the degreasing and molding steps be sufficiently suppressed/cured; and gaps between particles of the powder or a dissolved gas be sufficiently removed, to thereby reduce bubbles to prevent unnecessary scattered light from being emitted.

The integral molding of the silica member by the mold molding has a great advantage in terms of manufacturing method in that a plurality of lens portions can be simultaneously formed. Particularly among LED packages in recent years, there have been an increasing number of packages each having placed therein a plurality of LEDs for the purpose of increasing the output. In this case, it is important that the positional relationship between individual LEDs and lens portions be accurately adjusted.

In the present invention, a window material and lens-like convex portions are manufactured in a state of being integrally formed, and as a result, the position of each of the lens portions is determined as a transfer of a position designed as a mold. Accordingly, there is an advantage in that the position can be extremely accurately determined. As the mold molding of a silica member, besides the press molding, there are known injection molding, transfer molding, a slip casting method, and the like (Patent Documents 4 to 17).

According to another embodiment of the present invention, there is provided a method of manufacturing a quartz glass member for an ultraviolet LED, including: a molding step of mixing silica powder and a binder component, followed by molding the resultant mixture to obtain a molded body having a predetermined shape; a heat treatment step of subjecting the molded body to heating treatment with various gases; and a vitrification step of vitrifying the molded body subjected to heat treatment into transparent glass after the heat treatment step, wherein the heat treatment step includes: a degreasing step for organic matter at 1,000° C. or less with an atmosphere containing oxygen; a purification step for a metal impurity at 1,200° C. or less with an atmosphere containing hydrogen chloride after the degreasing step; and a step of promoting repairing of an oxygen-deficient defect at a wavelength of about 250 nm at 1,150° C. or less with an oxidizing atmosphere after the purification step.

The molding step suitably includes a molding step with a metal mold.

The oxidizing atmosphere suitably includes an atmosphere containing oxygen and/or water vapor.

The vitrification step is suitably performed at 1,700° C. or less.

The silica powder suitably contains at least one kind of spherical silica, and the silica powder suitably has an Al concentration of 70 ppm or less.

The method of manufacturing a quartz glass member for an ultraviolet LED suitably further includes performing heating treatment with a hydrogen atmosphere after the vitrification step.

The ultraviolet LED is suitably configured to emit ultraviolet light having a wavelength of from 200 nm to 400 nm.

Advantageous Effects of the Invention

First, the present invention exhibits the remarkable effect capable of providing the silica glass member to be used for hermetic sealing of an ultraviolet LED configured to emit ultraviolet light in a wavelength range of from 200 nm to 350 nm, in particular, the silica glass member for hermetic sealing of an ultraviolet SMD LED element to be suitably used for hermetic sealing of, and as a transmission window material for, a surface mount-type package (SMD) having an ultraviolet LED mounted thereon and configured to emit ultraviolet light in a wavelength range of from 200 nm or more to 350 nm or less.

Secondly, the present invention exhibits the remarkable effect capable of providing the method of manufacturing a quartz glass member for an ultraviolet LED, which involves repairing an oxygen-deficient defect so that there can be obtained a quartz glass member for an ultraviolet LED improved in light absorption at a wavelength of about 250 nm and free of absorption due to a structural defect at a wavelength of from 200 nm to 400 nm.

DESCRIPTION OF EMBODIMENTS

Embodiments of the present invention are described below with reference to the attached drawings. However, these embodiments are described as examples, and it is understood that various modifications may be made thereto without departing from the technical spirit of the present invention.

Figure 1:
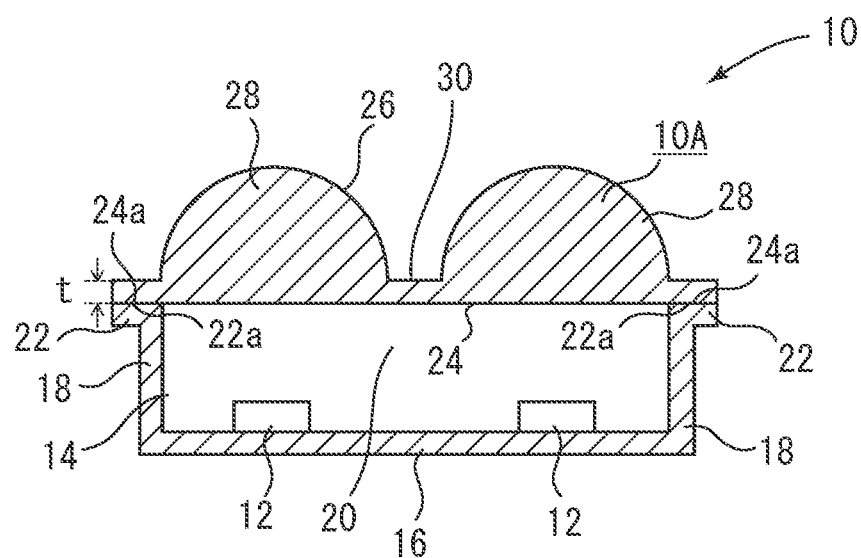
FIG. 1 is a cross-sectional explanatory view for illustrating a case one embodiment in which an ultraviolet SMD LED element is sealed with one embodiment of a silica glass member for hermetic sealing according to the present invention.
Figure 2:
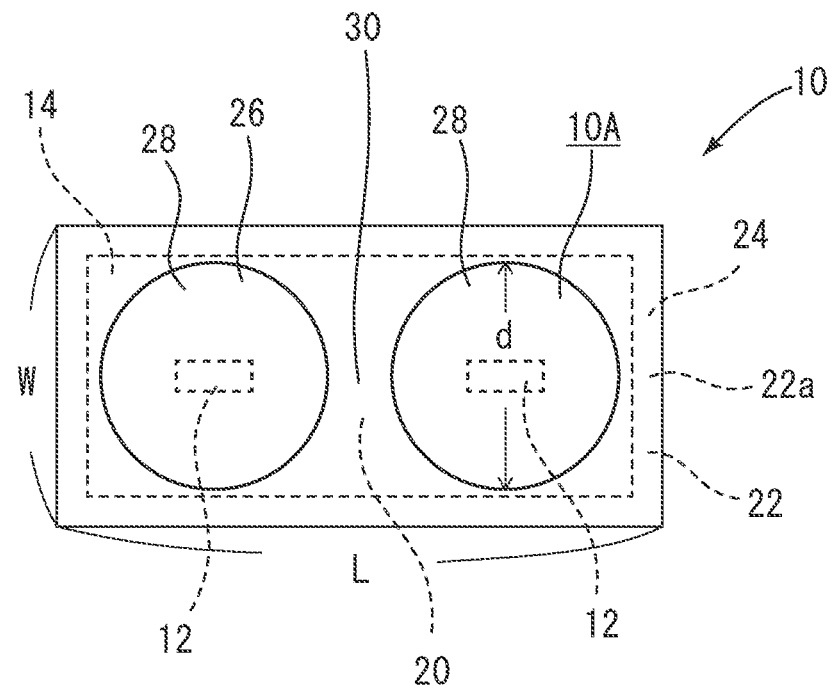
FIG. 2 is a planar explanatory view of the silica glass member for hermetic sealing illustrated in FIG. 1.
Figure 3:
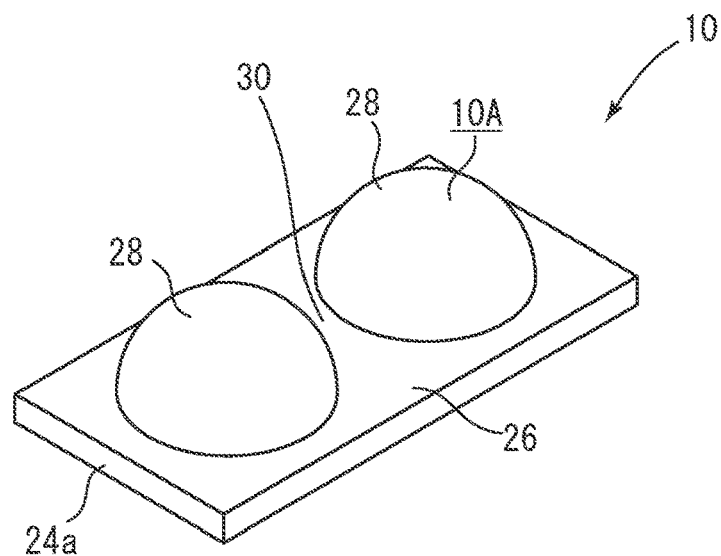
FIG. 3 is a schematic perspective explanatory view of the silica glass member for hermetic sealing illustrated in FIG. 1.

One embodiment of a silica glass member for hermetic sealing according to the present invention is described below. FIG. 1 to FIG. 3 are explanatory diagrams for illustrating a case in which ultraviolet SMD LED elements 12 are sealed with one embodiment of a silica glass member 10 for hermetic sealing according to the present invention. FIG. 1 is a cross-sectional explanatory diagram, FIG. 2 is a planar explanatory diagram, and FIG. 3 is a schematic perspective explanatory diagram. In FIG. 1, reference numeral 14 denotes a hermetic sealing container, which has a bottom wall 16 and a side wall 18, and is configured to open upward through an opening 20. The upper surface of an upper end outer peripheral portion 22 of the side wall 18 of the hermetic sealing container 14 is formed to be a plain surface to serve as a container outer periphery joining plain surface 22a. The ultraviolet SMD LED elements 12 are placed on the upper surface of the bottom wall 16. In the example illustrated in FIG. 1 and FIG. 2, there is illustrated an example in which two ultraviolet SMD LED elements 12 are placed. However, two or more ultraviolet SMD LED elements 12 may be arranged, and for example, four or six ultraviolet SMD LED elements 12 may be arranged.

The silica glass member 10 for hermetic sealing of the present invention is not particularly limited in terms of dimensions as long as the opening 20 of the hermetic sealing container 14 can be sealed therewith. For example, in the case of the example illustrated in FIG. 1 and FIG. 2, the dimensions are set as follows: a width W of the silica glass member 10 for hermetic sealing illustrated in FIG. 2: 3.5 mm, a length L of the silica glass member 10 for hermetic sealing illustrated in FIG. 2: 7 mm, a diameter d of each of lens-like convex portions 28 illustrated in FIG. 2: 3 mm, and a thickness t of a portion at a substrate joining plain surface 24a illustrated in FIG. 1: 1 mm.

The silica glass member 10 for hermetic sealing includes a silica glass substrate 10A, which is homogeneously and integrally formed without an internal boundary, and is configured to emit light in a wavelength range of from 250 nm to 350 nm. The silica glass substrate 10A has a first surface 24 on an inside opposed to the SMD LED element 12 and a second surface 26 on an outside corresponding to the first surface 24. The outer peripheral portion of the first surface 24 has formed therein the substrate joining plain surface 24a for joining to the container outer periphery joining plain surface 22a. Meanwhile, the second surface 26 on the outside corresponding to the first surface 24 has formed therein the lens-like convex portions 28 configured to process emitted light from the ultraviolet SMD LED elements 12. In the example illustrated in FIG. 1, there is illustrated an example in which two lens-like convex portions 28 are formed in a parallel state with a connecting flat portion 30 interposed therebetween, corresponding to the two ultraviolet SMD LED elements 12 being placed in the hermetic sealing container 14.

With reference to the configuration described above, its action is described. Under a state in which the container outer periphery joining plain surface 22a of the hermetic sealing container 14, in which the two ultraviolet SMD LED elements 12 are placed on the bottom wall 16, and the substrate joining plain surface 24a are joined to each other, the hermetic sealing container 14 is covered with the silica glass member 10 for hermetic sealing, to thereby bring the inside of the hermetic sealing container 14 into a hermetically sealed state. Thus, emitted light from the ultraviolet SMD LED elements 12 is processed with satisfactory light extraction efficiency.

The shape of the silica glass substrate 10A may be as illustrated in FIG. 1 to FIG. 3, in which the entirety of the first surface 24 is formed to be a plain surface and the second surface 26 has formed therein the lens-like convex portions 28 each having a hemispherical shape. However, the shape of the silica glass substrate 10A is not limited thereto, and any other shape may also be adopted as long as the shape can process emitted light from the ultraviolet SMD LED elements 12.

Figure 4:
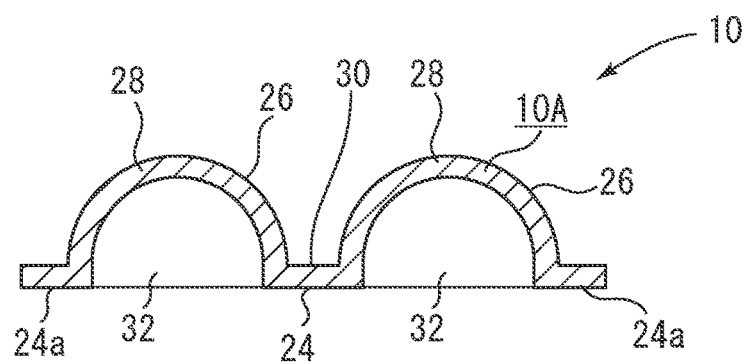
FIG. 4 is a cross-sectional explanatory view for illustrating another embodiment of a silica glass member for hermetic sealing according to the present invention.
Figure 5:
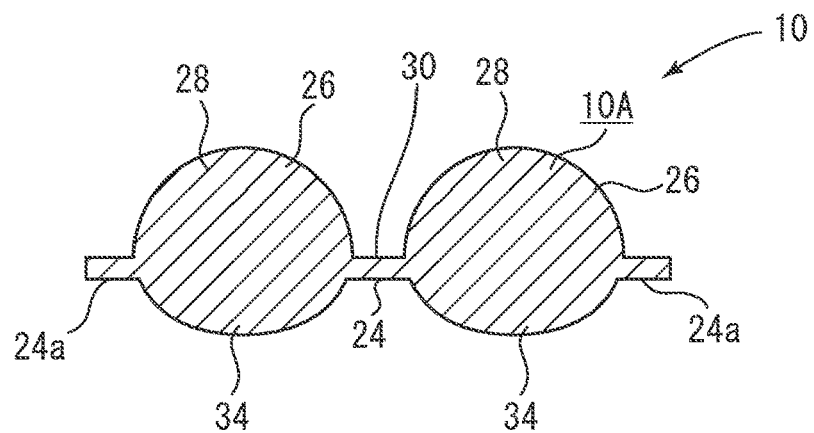
FIG. 5 is a cross-sectional explanatory view for illustrating still another embodiment of a silica glass member for hermetic sealing according to the present invention.

Examples of other shapes of the silica glass substrate 10A are illustrated in FIG. 4 and FIG. 5. In the example illustrated in FIG. 4, the two lens-like convex portions 28 are each formed in a hemispherical shape having formed therein a hollow portion 32. In the example illustrated in FIG. 5, as the two lens-like convex portions 28, the lens-like convex portions 28 each having a hemispherical shape are formed in the second surface 26 as in FIG. 1, while hanging enlarged portions 34 each having an ellipsoidal shape are formed in the first surface, corresponding to the two lens-like convex portions 28 each having a hemispherical shape. Also when the hermetic sealing container 14 in which the ultraviolet SMD LED elements 12 are placed is brought into a hermetically sealed state using the silica glass member 10 for hermetic sealing with the silica glass substrate 10A having the shape of each of FIG. 4 and FIG. 5, emitted light from the ultraviolet SMD LED elements 12 can be processed with satisfactory light extraction efficiency, as with the example of FIG. 1 to FIG. 3.

One embodiment of a method of manufacturing a quartz glass member for an ultraviolet LED according to the present invention is described below. In the manufacturing method of the present invention, an oxygen-deficient defect is generated by a chlorine-based gas to be used in purification treatment intended to remove a metal impurity, but heat treatment with an oxidizing atmosphere for repairing the oxygen-deficient defect is performed to repair the oxygen-deficient defect. Thus, there can be obtained a quartz glass member for an ultraviolet LED improved in light absorption at a wavelength of about 250 nm and free of absorption due to a structural defect at a wavelength of from 200 nm to 400 nm. An atmosphere containing oxygen and/or water vapor is suitably used as the oxidizing atmosphere.

In addition, in terms of transmittance, bubbles, surface shape, and the like, which are required characteristics for use as an optical member for an ultraviolet LED, characteristics equal to or higher than those of quartz glass produced by subjecting bulk quartz glass to grinding processing are required, and quartz glass to be suitably used for an optical member for an ultraviolet LED can be obtained by the following method.

In a molding step, after mixing of silica powder and binder component, the raw materials subjected to kneading involving degassing treatment may be molded with a metal mold. In a heat treatment step, the following steps are performed: a degreasing step at 1,000° C. or less with an atmosphere containing oxygen; a purification step for a metal impurity at 1,200° C. or less with an atmosphere containing hydrogen chloride; and a step of repairing an oxygen-deficient defect at a wavelength of about 250 nm at 1,150° C. or less with an oxidizing atmosphere. A vitrification step after the heat treatment step is suitably performed at 1,700° C. or less. An Al concentration in the silica powder serving as a main raw material is suitably 70 ppm or less. It is more preferred that heating treatment with a hydrogen atmosphere be performed after the vitrification step. With this, quartz glass to be suitably used for an optical member for an ultraviolet LED can be obtained.

The degassing treatment of the raw material has an effect of suppressing the generation of bubbles during the vitrification step.

Examples of the binder component include cellulose-based components (methyl cellulose, carboxymethyl cellulose, and hydroxyethyl alcohol), agar, vinyl-based components (polyvinyl alcohol and polyvinyl pyrrolidone), starch-based components (dialdehyde starch, dextrin, and polylactic acid), acrylic components (sodium polyacrylate and methyl methacrylate), and a plant viscous substance. Of those, polyvinyl alcohol or methyl cellulose is suitable.

When the temperature of the degreasing step exceeds 1,000° C., crystallization proceeds during this step to make it difficult to perform vitrification into transparent glass again through the subsequent steps. Therefore, the degreasing step is suitably performed at 1,000° C. to 400° C., more preferably 1,000° C. to 600° C.

The purification step becomes more effective as its temperature increases. However, when the temperature exceeds 1,200° C., shrinkage of a molded body proceeds to make it difficult for a gas to penetrate the inside of the molded body in the treatment with an atmosphere containing oxygen and/or water vapor in the next step, to thereby reduce the effect of repairing an oxygen-deficient defect. Therefore, the purification step is suitably performed at 1,200° C. to 800° C., more preferably 1,200° C. to 1,000° C.

When the temperature of the step of promoting repairing of an oxygen-deficient defect exceeds 1,150° C., likewise, crystallization becomes liable to proceed to make it difficult to perform vitrification into transparent glass. Therefore, the step of promoting repairing of an oxygen-deficient defect is suitably performed at 1,150° C. to 800° C., more preferably 1,100° C. to 950° C.

It is known that, when the silica powder serving as a main raw material or any of various additives contains a metallic element as an impurity, crystallization is accelerated in various heat treatments, and in particular, as a heat treatment temperature increases, the rate of the crystallization increases. In the present invention, when Al is present in the silica powder at a concentration of more than 70 ppm, a transparent glass body cannot be obtained, and a white and opaque crystallized product is obtained. Therefore, the Al concentration of the silica powder is preferably 70 ppm or less.

When the molding step is performed with a metal mold, the glass member can be produced in a larger quantity and more inexpensively than by prior art grinding and polishing processing, and hence a great contribution can be made to the widespread use of ultraviolet LEDs. Injection molding, press molding, transfer molding, or the like may be suitably used as a molding method.

In addition, when the glass member is subjected to the heat treatment with a hydrogen atmosphere, hydrogen molecules can be incorporated into the glass, and hence the following effect can be expected: even when a structural defect is generated in the glass by light emitted by an ultraviolet LED, the structural defect is repaired.

Through the use of the method of manufacturing a quartz glass member for an ultraviolet LED of the present invention, the silica glass member for hermetic sealing of the present invention can be suitably manufactured.

EXAMPLES

Now, the present invention is more specifically described by way of Examples. Needless to say, however, the present invention is not limited to these Examples.

Example 1

(Formation of Plastic Matter)

79 Parts by weight of mixed powder obtained by mixing spherical synthetic silica powder having a diameter of 1.2 μm (product name: ADMAFINE SO-E3) and spherical synthetic silica powder having a diameter of 2 μm (product name: ADMAFINE SO-E5) at a weight ratio of 1:1, 20 parts by weight of an aqueous solution of 7.8 wt % METOLOSE (product name: SM-4000), and 1 part by weight of a lubricant (product name: UNILUBE 50MB-2) were mixed and then kneaded with a triple roll mill to form plastic matter. The term "plastic matter" as used herein refers to a kneaded product of silica glass powder, in a state of having higher viscosity than a slurry, and having hardness and plasticity comparable to those of a clay.

(Degassing Operation)

The formed plastic matter is degassed by being further kneaded under reduced pressure. Specifically, for example, kneading extrusion is performed using a kneading extrusion molding machine manufactured by Miyazaki Iron Works Co., Ltd. under a reduced pressure of 0.1 MPa, with the result that the generation of bubbles after sintering can be reduced to a required degree.

(Molding with Metal Mold)

The plastic matter subjected to the degassing treatment was injection-molded into a metal mold at an increased pressure of 120 MPa to provide a molded body having a predetermined shape. Here, with regard to the metal mold, the surface roughness of a sealing portion of a plain surface portion needs to be finished to 0.1 μm or less, preferably 0.05 μm or less in terms of Ra value. Similarly, the surface roughness of a lens-like projecting portion also needs to be finished to 0.1 μm or less, preferably 0.05 μm or less in terms of Ra value. Further, as a mold shape, a plain surface part for sealing needs to satisfy very high flatness in order to realize hermetic sealing, but in the case of a metal mold, sufficient flatness can be realized even with general processing accuracy.

(Air Drying)

The removed molded body (hereinafter green body) was air-dried in a clean atmosphere having a cleanliness level of about 10,000 at room temperature for about 12 hours.

(Atmosphere Heat Treatment)

The green body after the drying was put in a silica glass container having a flat bottom portion, and together with the container, was subjected to heat treatment in a horizontal tubular furnace having a furnace core tube made of silica glass under various atmospheres and temperatures.

(Degreasing)

The temperature in the furnace was increased from room temperature at a temperature increase rate of 20° C./min to 800° C. and kept thereat. The atmosphere at the time of the temperature increase is 100% nitrogen. After the temperature in the furnace had stabilized at 800° C., nitrogen was stopped, and the temperature was kept for 1 hour while oxygen was flowed at a concentration of 100%. Thus, organic matter, such as METOLOSE, contained in the green body was completely oxidized and removed.

(Purification)

After the completion of the degreasing treatment with an oxygen atmosphere, the oxygen was switched to 100% nitrogen, and the temperature in the furnace was again increased at a temperature increase rate of 20° C./min to 1,200° C. and kept thereat. The nitrogen was switched to 100% hydrogen chloride, and purification treatment with hydrogen chloride was performed for 1 hour. The purification treatment reduces the concentrations of metal impurities, such as an alkali metal, iron, and copper, in silica glass. Meanwhile, hydrogen chloride gas reacts with Si—OH in the silica glass to form a Si—Cl bond, and hence, when the green body after the purification treatment is sintered as it is, the following reaction occurs: $2Si—Cl \rightarrow Si=Si+Cl_2$. The Si=Si bond is a structural defect called an oxygen-deficient defect. The Si=Si bond has absorption at a wavelength of 245 nm, and at the same time, has extremely weak resistance to ultraviolet light. Accordingly, the defect is not suited for the purpose of the present invention, and hence needs to be cured.

(Oxidation)

After the purification treatment, the hydrogen chloride serving as the atmosphere gas was switched to 100% nitrogen, and the furnace temperature was decreased at a temperature decrease rate of 20° C./min to 1,050° C. and kept at 1,050° C. In addition, after it was confirmed that the furnace temperature had reached 1,050° C., the nitrogen was switched to 100% oxygen, and the temperature was kept for 1 hour. After the treatment, the oxygen was replaced with nitrogen, followed by cooling to room temperature, and the resultant was removed.

(Sintering)

The removed green bodies were arranged on a smooth carbon plate with their convex portions facing up, and were placed in a vacuum furnace. The inside of a vacuum chamber was evacuated to a vacuum ($1 \times 10^{-2}$ Pa), and then the temperature was increased at a temperature increase rate of 20° C./min to 1,650° C., and kept at 1,650° C. for 20 minutes while a vacuum break (normal pressure 10 MPa) was performed with nitrogen. After that, electricity was turned off to cool the furnace. After 10 hours, the resultant was removed. Thus, a silica glass member for LED hermetic sealing of interest was obtained.

(Evaluation)

(1) Surface Roughness Data (Surface Roughness Data on Sealing Portion and Lens Portion)

The surface roughness of a sealing portion (substrate joining plain surface) and a convex portion were measured with a Mitutoyo surface roughness meter. The results are shown in Table 1. It was confirmed that the surface roughness of each of the portions fell within a predetermined range. In Table 1, measurement results at three measurement points (n) are shown.

TABLE 1

| Portion | | Ra (μm) | Measurement length | Speed |
|---|---|---|---|---|
| Sealing portion | n = 3 | 0.139 | 2 mm | 0.5 mm/sec |
| | | 0.133 | | |
| | | 0.167 | | |
| | Average | 0.146 | | |
| | Max | 0.167 | | |
| | Min | 0.133 | | |
| Convex portion | n = 3 | 0.376 | 0.5 mm | 0.1 mm/sec |
| | | 0.327 | | |
| | | 0.244 | | |
| | Average | 0.316 | | |
| | Max | 0.376 | | |
| | Min | 0.244 | | |

(2) Transmittance Data

Figure 6:
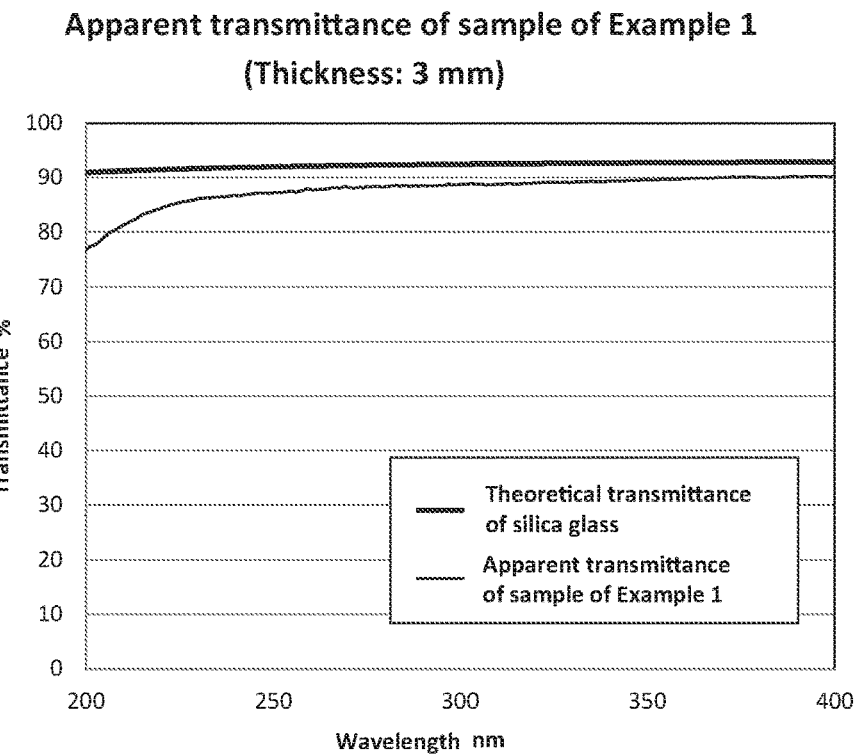
FIG. 6 is a graph for showing the measurement results of the transmittance of a silica glass member produced in Example 1 together with the theoretical transmittance of silica glass.

Transmittance measurement cannot be performed for a lens shape. Therefore, a transparent flat plate measuring 20 mm×20 mm×2 mm was produced using exactly the same materials and manufacturing method as those of Example 1 and subjected to general transmittance measurement (measurement apparatus: UV/VIS/NIR SPECTROMETER LAMBDA 900 manufactured by PerkinElmer, Inc.). The results are shown in Table 2 and FIG. 6 (graphical representation of an apparent transmittance and a theoretical transmittance). An internal transmittance for ultraviolet light having a wavelength of 300 nm to 400 nm and an internal transmittance for ultraviolet light having a wavelength of 245 nm or more and less than 300 nm were determined from the apparent transmittance by the calculation expression shown below. The internal transmittances are shown in Table 2. It was confirmed that each of the internal transmittances fell within a predetermined range.

Internal Transmittance: determined from (AT/TT)×100 for an apparent transmittance AT % at a thickness of 3 mm using a theoretical transmittance TT % (value obtained by subtracting reflection losses at a front surface and a back surface from 100%) of quartz glass at each wavelength shown in Table 2.

TABLE 2

Numerical Range of Transmittance derived from Example 1

| Wavelength (nm) | Theoretical transmittance of Example 1 (%) | Apparent transmittance of Example 1 (%) | Internal transmittance of Example 1 (%) |
|---|---|---|---|
| 400 | 92.9 | 90.2 | 97.1 |
| 350 | 92.7 | 89.6 | 96.6 |
| 300 | 92.5 | 88.7 | 96.0 |
| 250 | 92.0 | 87.2 | 94.8 |
| 245 | 91.9 | 87.1 | 94.7 |

Figure 7:
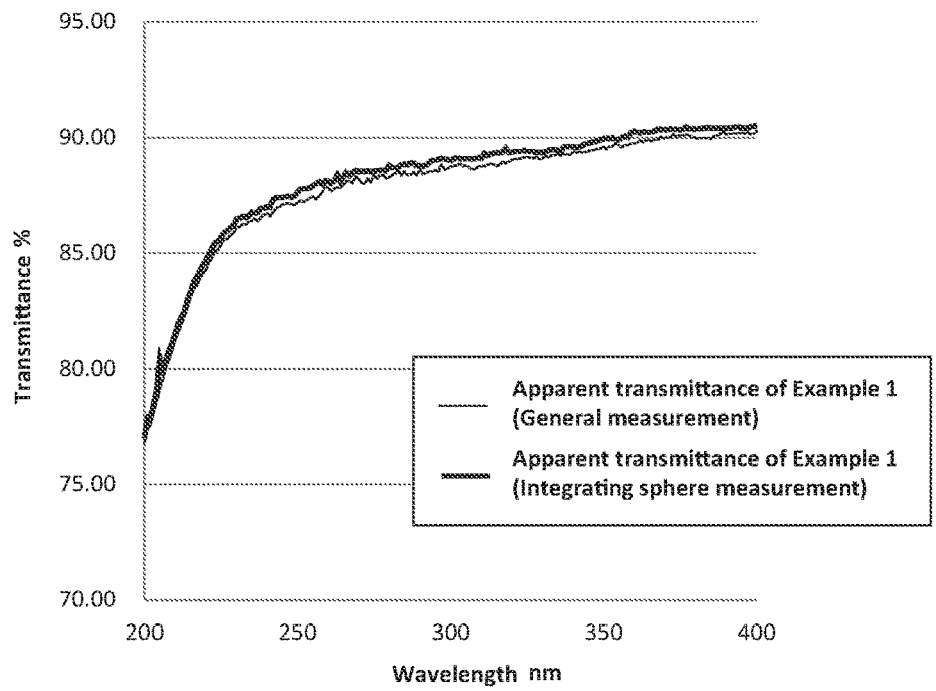
FIG. 7 is a graph for showing the measurement results of the transmittance of the silica glass member produced in Example 1 obtained using an integrating sphere together with measurement results obtained by general measurement.

Transmittance Measurement with Integrating Sphere: measured using measurement apparatus: UV/VIS/NIR SPECTROMETER LAMBDA 900 manufactured by PerkinElmer, Inc., integrating sphere: MODEL #150MM RSA ASSY. The results are shown in Table 3 and FIG. 7 together with the results of the general transmittance measurement, and calculated differences therebetween are shown in Table 3. As apparent from Table 3, it was confirmed that the differences each fell within a predetermined range.

TABLE 3

| | General measurement (%) | Integrating sphere measurement (%) | Difference (%) |
|---|---|---|---|
| Average value for wavelengths of from 345 nm to 355 nm | 89.56 | 89.89 | 0.33 |
| Average value for wavelengths of from 295 nm to 305 nm | 88.73 | 89.07 | 0.34 |
| Average value for wavelengths of from 245 nm to 255 nm | 87.21 | 87.63 | 0.41 |

(3) Measurement of Diameters and Numbers of Bubbles:

Transmittance measurement cannot be performed for a lens shape. Therefore, a transparent flat plate measuring 20 mm×20 mm×2 mm was produced using exactly the same materials and manufacturing method as those of Example 1, and was further divided and polished to produce three transparent flat plates (volume: 0.1 cm$^3$) each measuring 10 mm×10 mm×1 mm. The diameters and numbers of bubbles were measured for those transparent flat plates with a microscope at a magnification of 100 times. Finally, the cross-sectional areas of the bubbles were converted to values per 0.1 cm$^3$ of volume. The measurement results are shown in Table 4. No bubble having a bubble diameter of 50 μm or more was observed. As a method of calculating an area, the maximum value of a bubble class was taken as a diameter (for example, calculation was performed assuming 20 μm to 30 μm as a diameter of 30 μm). It was confirmed that the use of silica glass having such cross-sectional area of bubbles enabled use as a silica glass member for hermetic sealing for an SMD package with a sufficiently suppressed scattering intensity.

TABLE 4

| Sample No. | Bubble diameter (μm) | Number | Cross-sectional area of bubbles of each class (mm$^2$) | Total cross-sectional area of bubbles (mm$^2$) |
|---|---|---|---|---|
| 1 | Up to 10 | 3 | 3.93E−05 | 9.03E−04 |
| | 10 to 20 | 1 | 1.57E−04 | |
| | 20 to 30 | 0 | 3.53E−04 | |
| | 30 to 40 | 1 | 6.28E−04 | |
| | 40 to 50 | 0 | 9.82E−04 | |
| 2 | Up to 10 | 5 | 1.96E−04 | 7.07E−04 |
| | 10 to 20 | 1 | 1.57E−04 | |
| | 20 to 30 | 1 | 3.53E−04 | |
| | 30 to 40 | 0 | 0.00E+00 | |
| | 40 to 50 | 0 | 0.00E+00 | |
| 3 | Up to 10 | 4 | 1.57E−04 | 4.71E−04 |
| | 10 to 20 | 2 | 3.14E−04 | |
| | 20 to 30 | 0 | 0.00E+00 | |
| | 30 to 40 | 0 | 0.00E+00 | |
| | 40 to 50 | 0 | 0.00E+00 | |

(4) OH Group Concentration: The OH group concentration of a silica glass sample measuring 20 mm×20 mm×2 mm produced using the same materials and manufacturing method as those of Example 1 was measured with an infrared spectrophotometer, and as a result, the contained OH group concentration was found to be 1.3 ppm. Further, in the oxygen treatment of Example 1, the oxygen was humidified by bubbling with water, and as a result, a silica glass body having OH group concentration of 4.6 ppm was obtained. When each of those samples was irradiated with ultraviolet light having a wavelength of 254 nm, fluorescence was not observed. Thus, the samples were each found to be suited as a silica glass member for hermetic sealing for an SMD package for a UV-LED.

Comparative Example 1

Figure 8:
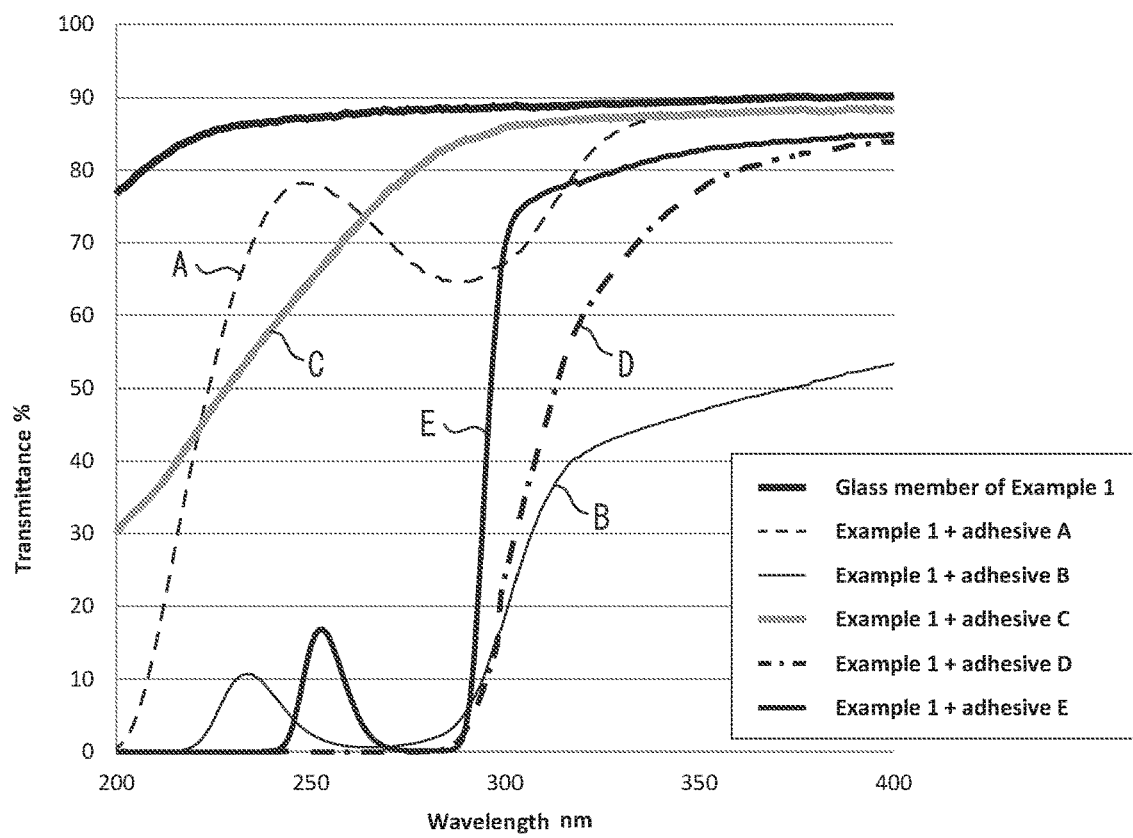
FIG. 8 is a graph for showing the measurement results of the transmittances of silica glass members produced using adhesives A to E in Comparative Example 1 together with the transmittance of the silica glass member of Example 1.

A planar silica glass plate material and a hemispherical lens were each independently produced, polished, and bonded to each other using any of adhesives A to E described below to produce a silica glass member having a shape similar to that of Example 1, which was subjected to transmittance measurement. The results are shown in FIG. 8. In FIG. 8, for comparison, the transmittance of the silica glass member of Example 1 is also shown. As apparent from FIG. 8, all the silica glass members joined with the adhesives were found not to have sufficient transmission properties for UVB (falling within a wavelength range of from 315 nm to 280 nm) and UVC (falling within a wavelength range of from 280 nm to 200 nm).

The adhesives A to E are as described below.

Adhesive A: vinyl chloride resin-based adhesive AR-066 manufactured by Cemedine Co., Ltd. (for bonding a vinyl chloride tube)

Adhesive B: thermosetting silicone-based adhesive KE-1886 manufactured by Shin-Etsu Chemical Co., Ltd. (e.g., a rubber for electrical and electronic sealing)

Adhesive C: water glass-based adhesive 37271-01 manufactured by Kanto Chemical Co., Inc. (for bonding ceramic or glass)

Adhesive D: synthetic rubber-based adhesive #14331 manufactured by Konishi Co., Ltd. (for bonding leather, synthetic rubber, or urethane foam)

Adhesive E: acrylic modified adhesive AX-033 manufactured by Cemedine Co., Ltd. (for bonding a metal, glass, or rubber)

Example 2

(Molding Step)

79 Parts by weight of mixed powder obtained by mixing powder having an average particle diameter of 1.0 μm (ADMAFINE SO-E3 manufactured by Admatechs Company Limited) and powder having an average particle diameter of 2.0 μm (ADMAFINE SO-E5 manufactured by Admatechs Company Limited) at a weight ratio of 1:1, 20 parts by weight of an aqueous solution of 7.8% methylcellulose (METOLOSE SM-4000 manufactured by Shin-Etsu Chemical Co., Ltd.), and 1 part by weight of a lubricant (UNILUBE 50MB-2 manufactured by NOF Corporation) were mixed and then kneaded with a triple roll mill. Through the use of a vacuum extrusion molding machine, the mixture was degassed, and subjected to kneading extrusion under a reduced pressure of 0.1 MPa.

The mixture of the silica powder and the binder subjected to the degassing treatment was injection-molded into a metal mold at an increased pressure of 120 MPa to provide a molded body having a predetermined shape. Here, with regard to the metal mold, an in-plane surface roughness needs to be finished to 0.1 μm or less, preferably 0.05 μm or less in terms of Ra value.

The thus produced molded body was air-dried in a clean atmosphere having a cleanliness level of about 10,000 at room temperature for about 12 hours.

(Heat Treatment Step)

The molded body after the drying was put in a quartz glass container having a flat bottom portion, and together with the container, was subjected to heat treatment in a horizontal tubular furnace having a furnace core tube made of quartz glass under various atmospheres and temperatures. In the heat treatment step, the following steps (a) to (c) were performed.

(a): (Degreasing Step)

The temperature in the furnace was increased from room temperature at a temperature increase rate of 20° C./min to 800° C. and kept thereat. The atmosphere at the time of the temperature increase is 100% nitrogen. After the temperature in the furnace had stabilized at 800° C., nitrogen was stopped, and the temperature was kept for 1 hour while oxygen was flowed at a concentration of 100%. Thus, organic matter, such as METOLOSE, contained in the molded body was completely oxidized and removed.

(b): (Purification Step)

After the completion of the degreasing treatment with an oxygen atmosphere, the oxygen was switched to 100% nitrogen, and the temperature in the furnace was again increased at a temperature increase rate of 20° C./min to 1,200° C. and kept thereat. The nitrogen was switched to 100% hydrogen chloride, and purification treatment with hydrogen chloride was performed for 1 hour. The purification treatment reduces the concentrations of metal impurities, such as an alkali metal, copper, and iron, in quartz glass. Meanwhile, hydrogen chloride reacts with Si—OH in the quartz glass to form a Si—Cl bond, and hence, when the molded body after the purification treatment is vitrified as it is, the following reaction occurs: $2Si-Cl \rightarrow Si=Si+Cl_2$. The Si=Si bond is a structural defect called an oxygen-deficient defect. The Si=Si bond has absorption at a wavelength of about 250 nm, and at the same time, has extremely weak resistance to ultraviolet light. Accordingly, the defect is not suited for the purpose of the present invention, and hence needs to be cured.

(c): (Step of Promoting Repairing of Oxygen-Deficient Defect)

After the purification treatment, the hydrogen chloride serving as the atmosphere gas was switched to 100% nitrogen, and the temperature was decreased at a temperature decrease rate of 20° C./min to 1,050° C. and kept thereat. The nitrogen was switched to oxygen 100%, and treatment for repairing an oxygen-deficient defect in quartz glass with oxygen was performed for 1 hour. After the treatment, the oxygen was switched to 100% nitrogen, followed by cooling to room temperature, and the resultant was removed.

(Vitrification Step)

The removed molded bodies were arranged on a smooth carbon plate, and placed in a vacuum furnace. The inside of a vacuum chamber was evacuated to a degree of vacuum of $1 \times 10^{-2}$ Pa, and then the temperature was increased at a temperature increase rate of 20° C./min to 1,650° C. After having reached 1,650° C., the temperature was kept for 10 minutes while a vacuum break was performed with nitrogen to increase the pressure to 0.1 MPa. After that, electricity was turned off to cool the furnace. After 10 hours, the resultant was removed. Thus, a quartz glass member for an ultraviolet LED of interest was obtained.

(Evaluation)

Physical property values were evaluated in accordance with the following measurement methods.

(1) Al Concentration

The obtained quartz glass member was decomposed with hydrofluoric acid, and subjected to measurement by ICP emission spectrometry.

(2) External Appearance

The obtained quartz glass member was visually observed. A case of transparent quartz glass was evaluated as "Satisfactory", a case of being opaque due to crystallization (devitrification) was evaluated as "Crystallization", and a case of containing visually recognizable bubbles was evaluated as "Bubbles".

(3) Absorption at Wavelength of 250 nm

A flat plate measuring 20 mm×20 mm×2 mm was produced, and subjected to measurement with a UV-VIS spectrophotometer in the wavelength range of from 200 nm to 400 nm to confirm the presence or absence of absorption at a wavelength of 250 nm. A case in which absorption at a wavelength of 250 nm was absent was evaluated as "Absent", a case in which the absorption was present was evaluated as "Present", and a case in which crystallization made measurement impossible was evaluated as "Unmeasurable".

Figure 9:
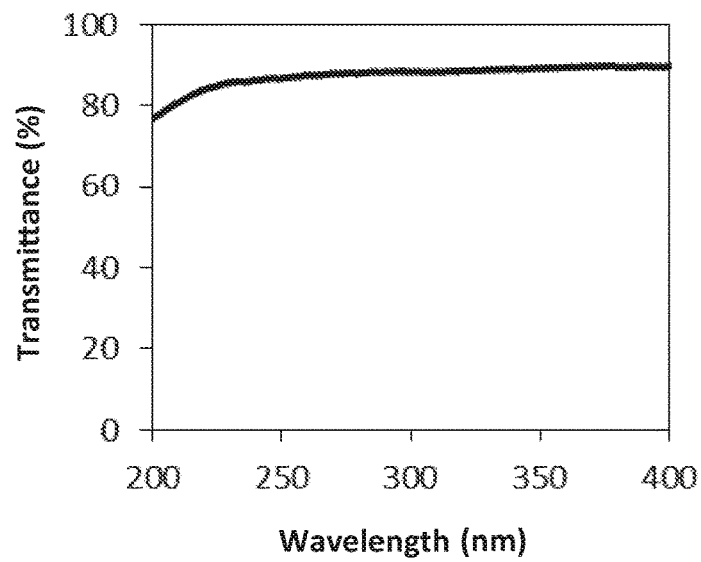
FIG. 9 is a graph for showing the transmittance measurement results of a quartz glass member for an ultraviolet LED obtained in Example 2 at wavelengths of from 200 nm to 400 nm.

Various conditions and measurement results are collectively shown in Table 5. The transmittance measurement results of the quartz glass member for an ultraviolet LED obtained in Example 2 at wavelengths of from 200 nm to 400 nm are shown in FIG. 9.

Example 3

A quartz glass member for an ultraviolet LED was obtained in the same manner as in Example 2 except that the treatment for repairing an oxygen-deficient defect was performed at a temperature of 1,050° C., and under an atmosphere containing water vapor produced by a method involving bubbling pure water kept at 30° C. with oxygen serving as a carrier.

Example 4

The quartz glass member for an ultraviolet LED obtained in Example 2 was subjected to hydrogen treatment in a hydrogen atmosphere at 400° C. and 0.8 MP (heating treatment with a hydrogen atmosphere) to introduce hydrogen molecules into the glass. Thus, a quartz glass member for an ultraviolet LED was obtained.

Example 5

A quartz glass member for an ultraviolet LED was obtained by performing the same treatments as in Example 2 except that mixed powder obtained by mixing powder having an average particle diameter of 0.25 μm (ADMAFINE SO-E1 manufactured by Admatechs Company Limited), powder having an average particle diameter of 1.0 μm (ADMAFINE SO-E3 manufactured by Admatechs Company Limited), and powder having an average particle diameter of 2.0 μm (ADMAFINE SO-E5 manufactured by Admatechs Company Limited) at a weight ratio of 1:1:2 was used as a raw material.

Comparative Example 2

Figure 10:
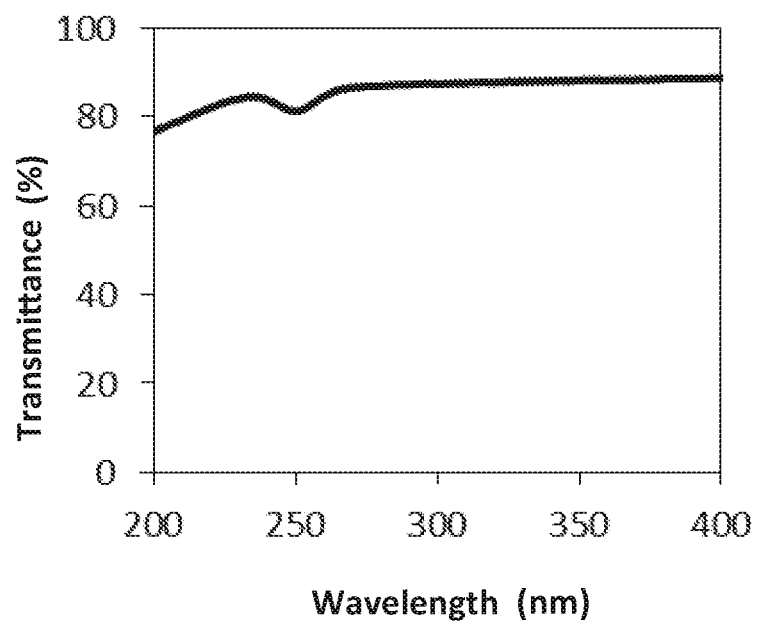
FIG. 10 is a graph for showing transmittance measurement results of a quartz glass member obtained in Comparative Example 2 at wavelengths of from 200 nm to 400 nm.

A quartz glass member was obtained in the same manner as in Example 2 except that the step of promoting repairing of an oxygen-deficient defect was not performed. The transmittance measurement results of the quartz glass member obtained in Comparative Example 2 at wavelengths of from 200 nm to 400 nm are shown in FIG. 10.

Comparative Example 3

Treatments were performed in the same manner as in Example 2 except that the degreasing temperature of the degreasing step in the heat treatment step was set to 1,100° C. The state after the heat treatment step was not particularly different from that of the sample of Example 2, and hence the sample of Comparative Example 3 was subjected to vitrification, but became opaque due to crystallization.

Comparative Example 4

Treatments were performed in the same manner as in Example 2 except that the purification temperature of the purification step in the heat treatment step was set to 1,350° C. Although the volume of the sintered body after the heat treatment step was slightly shrunk, the sintered body was subjected to vitrification as it was. As a result, a large number of extremely fine bubbles were mixed therein.

Comparative Example 5

Treatments were performed in the same manner as in Example 2 except that the oxygen defect repairing temperature of the step of promoting repairing of an oxygen-deficient defect in the heat treatment step was set to 1,200° C. The state after the heat treatment was not particularly different from that of the sample of Example 2, and hence the sample of Comparative Example 5 was subjected to vitrification, but became opaque due to crystallization.

Comparative Example 6

The glass member obtained in Comparative Example 2 was kept in an oxygen atmosphere at 1,100° C. for 10 hours. The transmittance of the resultant sample was measured. As a result, it was found that, although absorption at a wavelength of 250 nm was slightly improved, the transmittance in the entire region of from 200 nm to 400 nm was reduced due to the influence of contamination caused by the heat treatment.

TABLE 5

| | | Example 2 | Example 3 | Example 4 | Example 5 | Comparative Example 2 | Comparative Example 3 | Comparative Example 4 | Comparative Example 5 | Comparative Example 6 |
|---|---|---|---|---|---|---|---|---|---|---|
| Degreasing | Temperature (° C.) | 800 | 800 | 800 | 800 | 800 | 1,100 | 800 | 800 | 800 |
| | Atmosphere | Oxygen | Oxygen | Oxygen | Oxygen | Oxygen | Oxygen | Oxygen | Oxygen | Oxygen |
| Purification | Temperature (° C.) | 1,200 | 1,200 | 1,200 | 1,200 | 1,200 | 1,200 | 1,350 | 1,200 | 1,200 |
| | Atmosphere | Hydrogen chloride | Hydrogen chloride | Hydrogen chloride | Hydrogen chloride | Hydrogen chloride | Hydrogen chloride | Hydrogen chloride | Hydrogen chloride | Hydrogen chloride |
| Defect repair | Temperature (° C.) | 1,050 | 1,050 | 1,050 | 1,050 | Absent | 1,050 | 1,050 | 1,200 | Absent |
| | Atmosphere | Oxygen | Water vapor + oxygen | Oxygen | Oxygen | | Oxygen | Oxygen | Oxygen | |
| Vitrification | Temperature (° C.) | 1,650 | 1,650 | 1,650 | 1,650 | 1,650 | 1,650 | 1,650 | 1,650 | 1,650 |
| | Atmosphere | Vacuum | Vacuum | Vacuum | Vacuum | Vacuum | Vacuum | Vacuum | Vacuum | Vacuum |
| Al concentration of silica powder (ppm) | | 50 | 50 | 50 | 70 | 50 | 50 | 50 | 50 | 50 |
| Oxygen treatment after vitrification | | Absent | Absent | Absent | Absent | Absent | Absent | Absent | Absent | Present |
| Hydrogen treatment | | Absent | Absent | Present | Absent | Absent | Absent | Absent | Absent | Absent |
| External appearance | | Satisfactory | Satisfactory | Satisfactory | Satisfactory | Satisfactory | Crystallization | Bubbles | Crystallization | Satisfactory |
| Absorption at wavelength of 250 nm | | Absent | Absent | Absent | Absent | Present | Unmeasurable | Present | Unmeasurable | Present |

REFERENCE SIGNS LIST

10: silica glass member for hermetic sealing, 10A: silica glass substrate, 14: hermetic sealing container, 16: bottom wall, 18: side wall, 20: opening, 22: upper end outer peripheral portion, 22a: container outer periphery joining plain surface, 24: first surface, 24a: substrate joining plain surface, 26: second surface, 28: lens-like convex portion, 30: connecting flat portion, 32: hollow portion, 34: hanging enlarged portion.

The invention claimed is:

1. A silica glass member for hermetic sealing of an ultraviolet SMD LED element that is configured to emit light in a wavelength range of from 250 nm to 350 nm and is placed in a hermetic sealing container having a container outer periphery joining plain surface formed in an outer peripheral portion thereof, the silica glass member for hermetic sealing comprising:
a silica glass substrate, which is homogeneously and integrally formed without an internal boundary, wherein the silica glass substrate has:
a first surface on an inside opposed to the SMD LED element; and
a second surface on an outside corresponding to the first surface, wherein an outer peripheral portion of the first surface has formed therein a substrate joining plain surface for joining to the container outer periphery joining plain surface, and the second surface on the outside corresponding to the first surface has formed therein a lens convex portion configured to process emitted light from the ultraviolet SMD LED element, wherein the substrate joining plain surface formed in the first surface has a surface accuracy equal to 1 μm or less and a surface roughness of 0.05 μm to 0.3 μm in terms of Ra value, and the lens convex portion in the second surface has a surface roughness of 0.05 μm to 0.5 μm in terms of Ra value.

2. A silica glass member for hermetic sealing according to claim 1, wherein a plurality of the lens convex portions are formed on the second surface.

3. A silica glass member for hermetic sealing according to claim 1, wherein the silica glass member for hermetic sealing has an internal transmittance at a thickness of 3 mm of 95% to 99% for ultraviolet light having a wavelength of 300 nm to 400 nm and an internal transmittance at a thickness of 3 mm of 92% to 99% for ultraviolet light having a wavelength of 245 nm or more and less than 300 nm.

4. A silica glass member for hermetic sealing according to claim 1, wherein respective differences between internal transmittances of the silica glass member for hermetic sealing at a thickness of 3 mm for ultraviolet light having wavelengths of 350 nm, 300 nm, and 250 nm measured using an integrating sphere and internal transmittances thereof at a thickness of 3 mm for ultraviolet light having wavelengths of 350 nm, 300 nm, and 250 nm in general measurement are each within 0.5%.

5. A silica glass member for hermetic sealing according to claim 1, wherein bubbles contained in the silica glass member for hermetic sealing each has a diameter equal to 50 μm or less, and the bubbles contained have a total cross-sectional area equal to $1\times10^{-3}$ mm$^2$ or less per 0.1 cm$^3$ of a volume of the silica glass member for hermetic sealing.

6. A silica glass member for hermetic sealing according to claim 1, wherein the silica glass member for hermetic sealing contains OH groups at a concentration of 0.1 ppm to 20 ppm.

7. An ultraviolet SMD LED element package comprising:
a silica glass member for hermetic sealing of an ultraviolet SMD LED element that is configured to emit light in a wavelength range of from 200 nm to 400 nm, in particular from 250 nm to 350 nm, and is placed in a hermetic sealing container having a container outer periphery joining plain surface formed in an outer peripheral portion thereof, the silica glass member for hermetic sealing comprising a silica glass substrate, which is homogeneously and integrally formed without an internal boundary, wherein the silica glass substrate comprises:
a first surface on an inside opposed to the SMD LED element; and
a second surface on an outside corresponding to the first surface, wherein an outer peripheral portion of the first surface has formed therein a substrate joining plain surface for joining to the container outer periphery joining plain surface, and the second surface on the outside corresponding to the first surface has formed therein a lens-like convex portion configured to process emitted light from the ultraviolet SMD LED element, wherein the silica glass member for hermetic sealing has an internal transmittance at a thickness of 3 mm of 95% to 99% for ultraviolet light having a wavelength of 300 nm to 400 nm and an internal transmittance at a thickness of 3 mm of 92% to 99% for ultraviolet light having a wavelength of 245 nm or more and less than 300 nm.

8. The ultraviolet SMD LED element package according to claim 7, wherein a plurality of the lens-like convex portions are formed on the second surface.

9. The ultraviolet SMD LED element package according to claim 7, wherein the substrate joining plain surface formed in the first surface has a surface accuracy of 1 μm or less and a surface roughness of 0.05 μm to 0.3 μm in terms of Ra value, and the lens-like convex portion in the second surface has a surface roughness of 0.05 μm to 0.5 μm in terms of Ra value.

10. The ultraviolet SMD LED element package according to claim 7, wherein respective differences between internal transmittances of the silica glass member for hermetic sealing at a thickness of 3 mm for ultraviolet light having wavelengths of 350 nm, 300 nm, and 250 nm measured using an integrating sphere and internal transmittances thereof at a thickness of 3 mm for ultraviolet light having wavelengths of 350 nm, 300 nm, and 250 nm in general measurement are each within 0.5%.

11. The ultraviolet SMD LED element package according to claim 7, wherein bubbles contained in the silica glass member for hermetic sealing each have a diameter of 50 μm or less, and the bubbles contained have a total cross-sectional area of $1\times10^{-3}$ mm$^2$ or less per 0.1 cm$^3$ of a volume of the silica glass member for hermetic sealing.

12. The ultraviolet SMD LED element package according to claim 7, wherein the silica glass member for hermetic sealing contains OH groups at a concentration of 0.1 ppm to 20 ppm.

13. A silica glass member for hermetic sealing of an ultraviolet SMD LED element that is configured to emit light in a wavelength range of from 250 nm to 350 nm and is placed in a hermetic sealing container having a container outer periphery joining plain surface formed in an outer peripheral portion thereof, the silica glass member for hermetic sealing comprising:
a silica glass substrate, which is homogeneously and integrally formed without an internal boundary, wherein the silica glass substrate has:
a first surface on an inside opposed to the SMD LED element; and
a second surface on an outside corresponding to the first surface, wherein an outer peripheral portion of the first surface has formed therein a substrate joining plain surface for joining to the container outer periphery joining plain surface, and the second surface on the outside corresponding to the first surface has formed therein a lens convex portion configured to process emitted light from the ultraviolet SMD LED element, wherein the silica glass member for hermetic sealing has an internal transmittance at a thickness of 3 mm of 95% to 99% for ultraviolet light having a wavelength of 300 nm to 400 nm and an internal transmittance at a thickness of 3 mm of 92% to 99% for ultraviolet light having a wavelength of 245 nm or more and less than 300 nm.

14. A silica glass member for hermetic sealing of an ultraviolet SMD LED element that is configured to emit light in a wavelength range of from 250 nm to 350 nm and is placed in a hermetic sealing container having a container outer periphery joining plain surface formed in an outer peripheral portion thereof, the silica glass member for hermetic sealing comprising:
a silica glass substrate, which is homogeneously and integrally formed without an internal boundary, wherein the silica glass substrate has:
a first surface on an inside opposed to the SMD LED element; and
a second surface on an outside corresponding to the first surface, wherein an outer peripheral portion of the first surface has formed therein a substrate joining plain surface for joining to the container outer periphery joining plain surface, and the second surface on the outside corresponding to the first surface has formed therein a lens convex portion configured to process emitted light from the ultraviolet SMD LED element, wherein respective differences between internal transmittances of the silica glass member for hermetic sealing at a thickness of 3 mm for ultraviolet light having wavelengths of 350 nm, 300 nm, and 250 nm measured using an integrating sphere and internal transmittances thereof at a thickness of 3 mm for ultraviolet light having wavelengths of 350 nm, 300 nm, and 250 nm in general measurement are each within 0.5%.

15. A silica glass member for hermetic sealing of an ultraviolet SMD LED element that is configured to emit light in a wavelength range of from 250 nm to 350 nm and is placed in a hermetic sealing container having a container outer periphery joining plain surface formed in an outer peripheral portion thereof, the silica glass member for hermetic sealing comprising:
a silica glass substrate, which is homogeneously and integrally formed without an internal boundary, wherein the silica glass substrate has:
a first surface on an inside opposed to the SMD LED element; and
a second surface on an outside corresponding to the first surface, wherein an outer peripheral portion of the first surface has formed therein a substrate joining plain surface for joining to the container outer periphery joining plain surface, and the second surface on the outside corresponding to the first surface has formed therein a lens convex portion configured to process emitted light from the ultraviolet SMD LED element, wherein bubbles contained in the silica glass member for hermetic sealing each has a diameter equal to 50 μm or less, and the bubbles contained have a total cross-sectional area equal to $1\times10^{-3}$ mm$^2$ or less per 0.1 cm$^3$ of a volume of the silica glass member for hermetic sealing.

16. A silica glass member for hermetic sealing of an ultraviolet SMD LED element that is configured to emit light in a wavelength range of from 250 nm to 350 nm and is placed in a hermetic sealing container having a container outer periphery joining plain surface formed in an outer peripheral portion thereof, the silica glass member for hermetic sealing comprising:
a silica glass substrate, which is homogeneously and integrally formed without an internal boundary, wherein the silica glass substrate has:
a first surface on an inside opposed to the SMD LED element; and
a second surface on an outside corresponding to the first surface, wherein an outer peripheral portion of the first surface has formed therein a substrate joining plain surface for joining to the container outer periphery joining plain surface, and the second surface on the outside corresponding to the first surface has formed therein a lens convex portion configured to process emitted light from the ultraviolet SMD LED element, wherein the silica glass member for hermetic sealing contains OH groups at a concentration of 0.1 ppm to 20 ppm.

\* \* \* \* \*